United States Patent [19]
Jewett

[11] Patent Number: 5,793,318
[45] Date of Patent: Aug. 11, 1998

[54] SYSTEM FOR PREVENTING OF CROSSTALK BETWEEN A RAW DIGITAL OUTPUT SIGNAL AND AN ANALOG INPUT SIGNAL IN AN ANALOG-TO-DIGITAL CONVERTER

[75] Inventor: Robert E. Jewett, Redwood City, Calif.

[73] Assignee: Hewlett-Packard Company, Palo Alto, Calif.

[21] Appl. No.: 795,220

[22] Filed: Feb. 5, 1997

[51] Int. Cl.$^6$ ..................................................... H03M 1/06
[52] U.S. Cl. ........................... 341/118; 341/89; 341/155
[58] Field of Search ........................... 341/89, 118, 143, 341/155

[56] References Cited

U.S. PATENT DOCUMENTS

| | | | |
|---|---|---|---|
| 4,001,779 | 1/1977 | Schiff | 371/37 |
| 4,600,942 | 7/1986 | Field et al. | 380/15 |
| 4,896,155 | 1/1990 | Craiglow | 341/120 |
| 5,146,457 | 9/1992 | Veldhuis et al. | 370/523 |
| 5,189,418 | 2/1993 | Bartz | 341/131 |
| 5,381,444 | 1/1995 | Tajima | 375/1 |
| 5,424,738 | 6/1995 | Barroue et al. | 341/118 |
| 5,528,239 | 6/1996 | Swanson et al. | 341/143 |

*Primary Examiner*—Richard T. Elms
*Assistant Examiner*—Kim N. Huynh

[57] ABSTRACT

The raw digital output signal generated at the transmitter by an ADC is XOR'd with a sequence of pseudo-random numbers to generate an encoded output signal. This removes all correlation between the analog input signal and the encoded output signal. Coherence between the encoded output signal and the analog input signal is prevented and the effects of crosstalk to the analog input signal are mitigated. In a first embodiment of the invention, the sequence of pseudo-random numbers is a sequence of one-bit pseudo-random numbers that are XOR'd with each bit of the raw digital output signal. In a second embodiment, the sequence of pseudo-random numbers is a sequence of N-bit pseudo-random numbers that are XOR'd with the N-bit words of the digital output signal. To recreate the original raw digital output signal in the receiver, a second XOR operation is performed between the encoded output signal and the sequence of pseudo-random numbers. Alternatively, a pseudo-random number generator located in each of the transmitter and receiver are synchronized to generate equal sequences of PRNs that encode the raw digital output signal and decode the encoded output signal. Intermediate digital pipelining may be used to add a decoding bit from the pseudo-random-number generator to the encoded output signal. Such additional bit may be stored in memory with the encoded output signal to permit later decoding.

20 Claims, 5 Drawing Sheets

SYSTEM FOR PREVENTING OF CROSSTALK BETWEEN A RAW DIGITAL OUTPUT SIGNAL AND AN ANALOG INPUT SIGNAL IN AN ANALOG-TO-DIGITAL CONVERTER

BACKGROUND OF THE INVENTION

1. Technical Field

The invention relates to electronic circuits. More particularly, the invention relates to the reduction of coherent interference between parts of the same circuit.

2. Description of the Prior Art

Mixed-signal systems are those that contain both analog and digital signals. Such systems often have unwanted crosstalk between the two domains. Crosstalk is defined as undesired noise appearing in one signal path as a result of coupling from another signal path.

An analog-to-digital converter (ADC) is an example of a mixed-signal system that is subject to crosstalk interference. In an ADC, the output is a digital representation of the analog input signal and thus is very closely related thereto. The raw digital output signal includes frequency components that might interfere with the analog input signal. Crosstalk from the raw digital output signal to the analog input signal could therefore cause spurious input signal levels.

In such systems, the digital output signals are generally large signals. For example, a 3 volt (V) swing may be generated in transistor-transistor logic (TTL) circuits. An emitter-coupled logic (ECL) circuit is designed for speed, and therefore does not have such large voltage swing, but has considerably faster transitions.

Furthermore, the digital output signals usually produce sharp transients on each clock cycle. Such sharp transitions have a high-frequency content that couples more readily back to the analog input signal. In extreme cases, the resulting coupling generates feedback that produces oscillations for direct current (DC) inputs. Where weaker coupling occurs, the feedback is not large enough to cause oscillations, but does cause some amount of coupling to the input that shows up as spurious signals either at half the sample rate or at various frequencies depending on the nature of the input signal. Thus, non-linearities and low-level spurious outputs are produced.

Standard measures taken to minimize crosstalk include shielding and supply isolation, clock dithering, differential inputs and outputs, optimizing the phase of the digital transitions, and adjustment of signal levels and slew rates to minimize either the "receiver" sensitivity or the "transmitter" power. Such methods are usually adequate for 60 to 100 decibels (dB) of isolation. For example, Swanson et al. *Low Noise Transmission of Output Data From Delta-Sigma Modulator,* U.S. Pat. No. 5,528,239 (18 Jun. 1996), describes a circuit providing more than 120 dB effective isolation for low-rate digital output signals.

However, as instrumentation and circuitry become more precise, the tolerable levels of signal interference are correspondingly reduced. For applications requiring a very low spurious signal level, crosstalk, spurious signals, or feedback generated during analog-to-digital conversion because of the relation between the input and the output produce significant real-time effects. However, the isolation levels of the prior art are not adequate to maintain the integrity of the digital output signal. Furthermore, increasingly miniaturized devices may not have sufficient space to accommodate the shielding and circuitry required by the prior art measures.

It would therefore be an advantage to provide a system and method for reducing the coherent interference between parts of an electronic circuit. It would be a further advantage if such system required minimal circuitry. It would be yet another advantage if such circuitry could also be used in addition to prior art measures to provide increased reduction of crosstalk.

SUMMARY OF THE INVENTION

The invention provides a system for preventing distortion in an analog-to-digital converter. An XOR is performed between the raw digital output signal of the ADC and a sequence of pseudo-random numbers to generate an encoded output signal. This removes all the correlation between the analog input signal and the encoded output signal. Coherence between the encoded output signal and the analog input signal is prevented, and the effects of crosstalk to the analog input signal are mitigated. The original raw digital output signal may be regenerated by performing an inverse XOR operation in the receiver.

In a first embodiment of the invention, the raw digital output signal is XOR'd with one-bit pseudo-random numbers. In a second embodiment, N-bit pseudo-random numbers are XOR'd with the N-bit words of the raw digital output signal.

To recreate in the receiver the original raw digital output signal generated in the transmitter by the ADC prior to the first XOR, a second XOR operation is performed between the encoded output signal and the pseudo-random numbers. Alternatively, a linear feedback shift register at the receiver is synchronized with the linear feedback shift register used to generate the pseudo-random numbers. Equal sequences are thereby produced to permit decoding of the signal.

In a second embodiment of the invention, a master synchronization circuit sends a signal out to each of the PRNGs to synchronize them. This signal is a single synchronization signal, a periodic signal, or a continuous single signal.

Intermediate digital pipelining may be used to add decoding bits or words from the pseudo-random-number generator to the encoded output signal. Such additional bits or words may be stored with the encoded output signal. These additional bits or words may be used at a later time to regenerate the raw digital output signal from the encoded output signal.

DETAILED DESCRIPTION OF THE INVENTION

The invention provides a system for preventing distortion in an analog-to-digital converter. Each bit of the raw digital output signal is XOR'd with a different pseudo-random bit to generate an encoded output signal. This removes all the correlation between the analog input signal and the raw digital output signal. Coherence between the raw digital output signal and the analog input signal is prevented, and the effects of crosstalk to the analog input signal are mitigated. An inverse XOR operation is performed in the receiver to recreate the original raw digital output signal.

Figure 1:
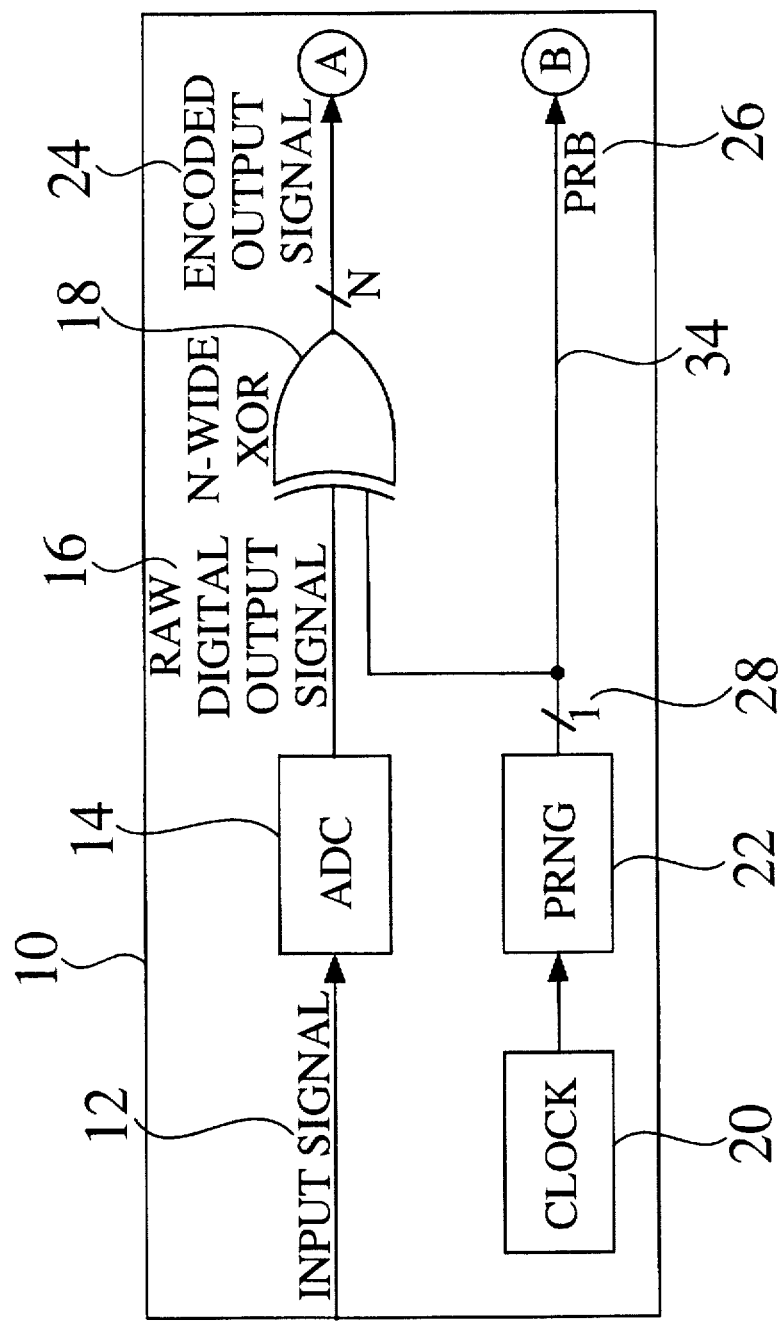
FIG. 1 is a schematic diagram of a system for preventing distortion in an analog-to-digital converter according to a first preferred embodiment of the invention.

FIG. 1 is a schematic diagram of a system 10 for preventing distortion in an analog-to-digital converter according to a first preferred embodiment of the invention. In this first embodiment, an analog input signal 12 is transmitted to an analog-to-digital converter (ADC) 14. The N-bit raw digital output signal 16 from the ADC is then communicated to an N-wide XOR gate 18.

A pseudo-random number generator (PRNG) 22 produces a sequence of pseudo-random numbers (PRNs) 28, which is also communicated to the XOR gate. In the first embodiment of the invention, the PRNs in the sequence of PRNs are 1-bit pseudo-random numbers. Both ADC and PRNG are synchronized by a clock 20. The XOR gate performs an XOR operation between each bit of the raw digital output signal and a respective one of the 1-bit PRNs in the PRN sequence generated by the PRNG. The XOR gate output is an encoded output signal 24 having N bit words. First-order coherence between the encoded output signal and the analog input signal is prevented because the PRN sequence generated by the PRNG is assumed to be uncorrelated with any analog signal.

The sequence of 1-bit PRNs 26 can be used in the receiver to re-generate the original raw digital output signal. The sequence of PRNs is transmitted on a line 34 running through the system to the receiver. This will be discussed in more detail with regard to FIG. 2.

It is well known in the prior art to use a linear feedback shift register (LFSR) as a pseudo random number generator. For example, Bartz, et al., Dither Error Correction, U.S. Pat. No. 5,189,418 (23 Feb. 1993) uses a PRNG to generate a sequence of dither numbers. However, the pseudo random numbers may be generated by any other appropriate means, including computer generation using programming techniques, such as those described in Knuth, *The Art of Computer Programming*. Alternatively, the raw digital output signal of the ADC may be XOR'd with random bits, perhaps generated from thermal noise—a technology already well known. Other methods for generating pseudo-random numbers include using PRN-generating chips.

In an alternative, equally preferred embodiment of the invention, N-bit pseudo-random numbers are XOR'd with respective N-bit words of the raw digital output signal. The N-bit PRNs are generated in the same manner as the 1-bit PRNs discussed above with regard to FIG. 1. Using an N-bit PRN in the XOR operation with each N-bit word of the raw digital output signal prevents all coherence between the encoded output signal and the analog input signal. Since second-order and higher-order coherence is prevented, the encoded output signal appears completely random. Use of an N-bit PRN therefore produces somewhat better encoding than does use of a 1-bit PRN.

Figure 2:
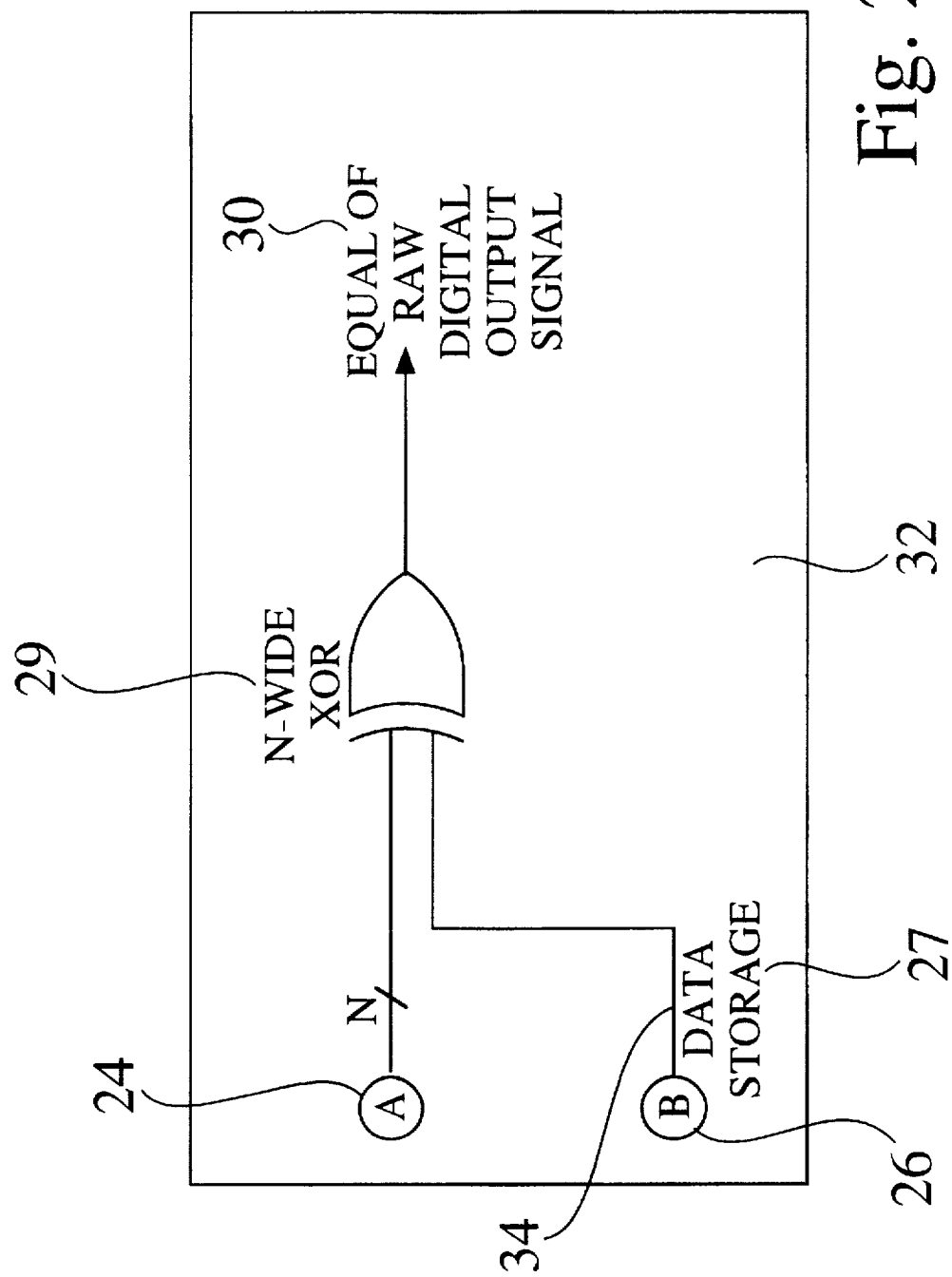
FIG. 2 is schematic diagram of a system for decoding the encoded output signal generated by the analog-to-digital converter according to the invention.

To recreate in the receiver the raw digital output signal generated by the ADC in the transmitter prior to the original XOR, the sequence of pseudo-random numbers used in the encoding XOR operation are transmitted to the receiver where they are used in another XOR operation to decode the encoded output signal. FIG. 2 is a schematic diagram of an example of a receiver 32 in which the encoded output signal is decoded and the resulting raw digital output signal is converted to an analog signal, according to the invention.

In the receiver shown in FIG. 2, the N-bit encoded output signal 24 is transmitted to a second XOR gate 29. The PRN sequence 26 that was previously used to encode the raw digital output signal at the first XOR gate is transmitted to the second XOR gate on a line 34 running through the system. The encoded output signal and the sequence of PRNs may be stored in a data storage device 27 prior to being transmitted to the second XOR gate. The sequence of PRNs is then XOR'd with the encoded output signal to re-generate the equal 30 of the original raw digital output signal.

Figure 3:
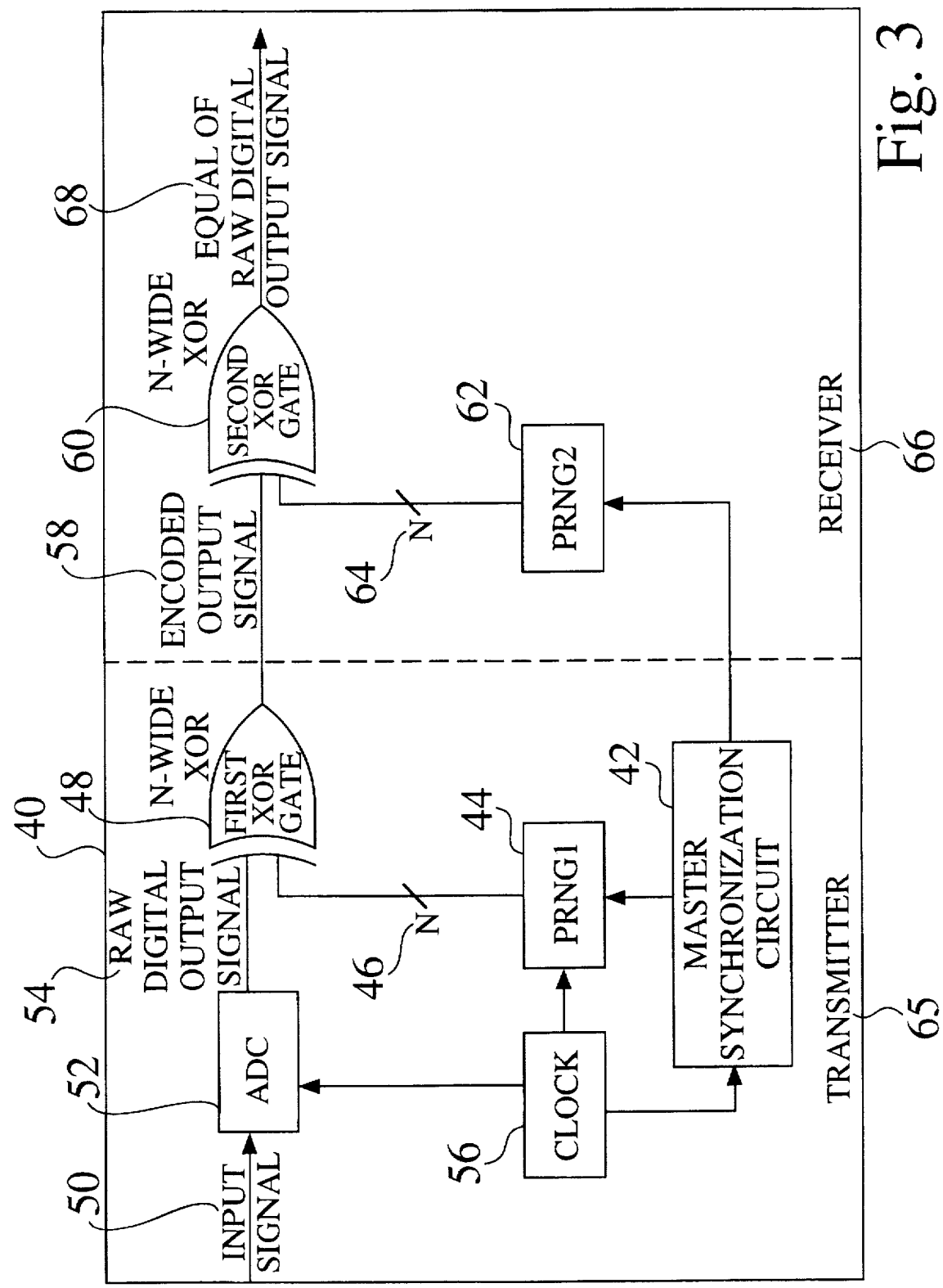
FIG. 3 is a schematic diagram showing a system for preventing distortion in an analog-to-digital converter according to a second, equally preferred embodiment of the invention.

Another embodiment of the invention uses multiple pseudo-random-number generators to generate identical PRN sequences in the transmitter and the receiver. FIG. 3 is a schematic diagram showing a system 40 for preventing distortion in an analog-to-digital converter, according to a second, equally preferred embodiment of the invention. If identical linear feedback shift registers respectively located in the transmitter and the receiver are synchronized, they will produce equal PRN sequences. Therefore, the PRN sequences used to encode the raw digital output signal of the ADC do not have to be transmitted with the encoded output signal to decode the encoded output signal in the receiver. When N-bit PRNs are used for the XOR operation, it is more efficient to transmit a synchronizing signal rather than the entire N-bit PRNs.

In the system shown in FIG. 3, a master synchronization circuit sends a signal to each of the PRNGs to synchronize them. This signal may be a single-pulse synchronization, a repetitive periodic synchronization pulse, or a continuous repetitive synchronizing signal.

A first PRNG 44 located in the transmitter 65 produces a sequence of N-bit PRNs 46, which is communicated to a first XOR gate 48. In one embodiment, the N-bit PRNs are 1-bit PRNs. In an alternative embodiment, the N-bit PRNs each comprise more than one bit.

An analog input signal 50 is transmitted to an ADC 52. The N-bit raw digital output signal 54 from the ADC is then communicated to the first N-wide XOR gate 48. The first XOR gate performs an XOR operation between each N-bit word of the raw digital output signal and a respective one of the N-bit PRNs 46 in the PRN sequence.

The encoded output signal 58 of the first XOR gate is N-bits wide. This encoded output signal is transmitted to a second N-wide XOR gate 60 at the receiver 66. A second PRNG 62 produces a sequence of PRNs 64, which is communicated to the second XOR gate 60. The master synchronization circuit 42 synchronizes both first and second PRNGs 44, 62. Thus, both PRNGs produce the same sequence of PRNs.

The XOR operation at the second XOR gate 60 produces an output 68 that is the equal of the original raw digital output signal 54. The encoded output signal is therefore decoded. The ADC and both PRNGs are synchronized by a clock 56.

The synchronization of the PRNGs can be implemented, for example, upon initialization of the system of which the invention is part. Alternatively, the synchronization can be a signal that is implemented in response to the XOR operation that encodes the raw digital output signal, or may be manually or automatically directed.

While a single-pulse synchronization signal is sufficient to synchronize multiple PRNGs, such system may be subject to inaccuracies or errors if the single pulse synchronization signal is misdirected, erroneous, or lost. Thus, it is preferable to transmit either a repetitive periodic synchronization pulse or a continuous repetitive synchronizing signal to the PRNGs.

The encoded output signal may be stored at any stage in the encoding or decoding processes. Similarly, the PRNs may be stored at any stage. For example, the encoded output signal may be stored in a memory or a magnetic storage device after the first XOR operation. The PRNs may be stored after the first XOR operation, and retrieved at a later time to decode the encoded output signal. Alternatively, the master synchronization signal may also be stored, to permit future synchronization of multiple PRNGs.

These signals may be stored in any appropriate type of storage device, such as a memory or magnetic disk drive. The stored signals and PRNs are preferably stored on the same storage device. However, the data and PRNs may also be stored on different devices, for example, to provide security.

Figure 4:
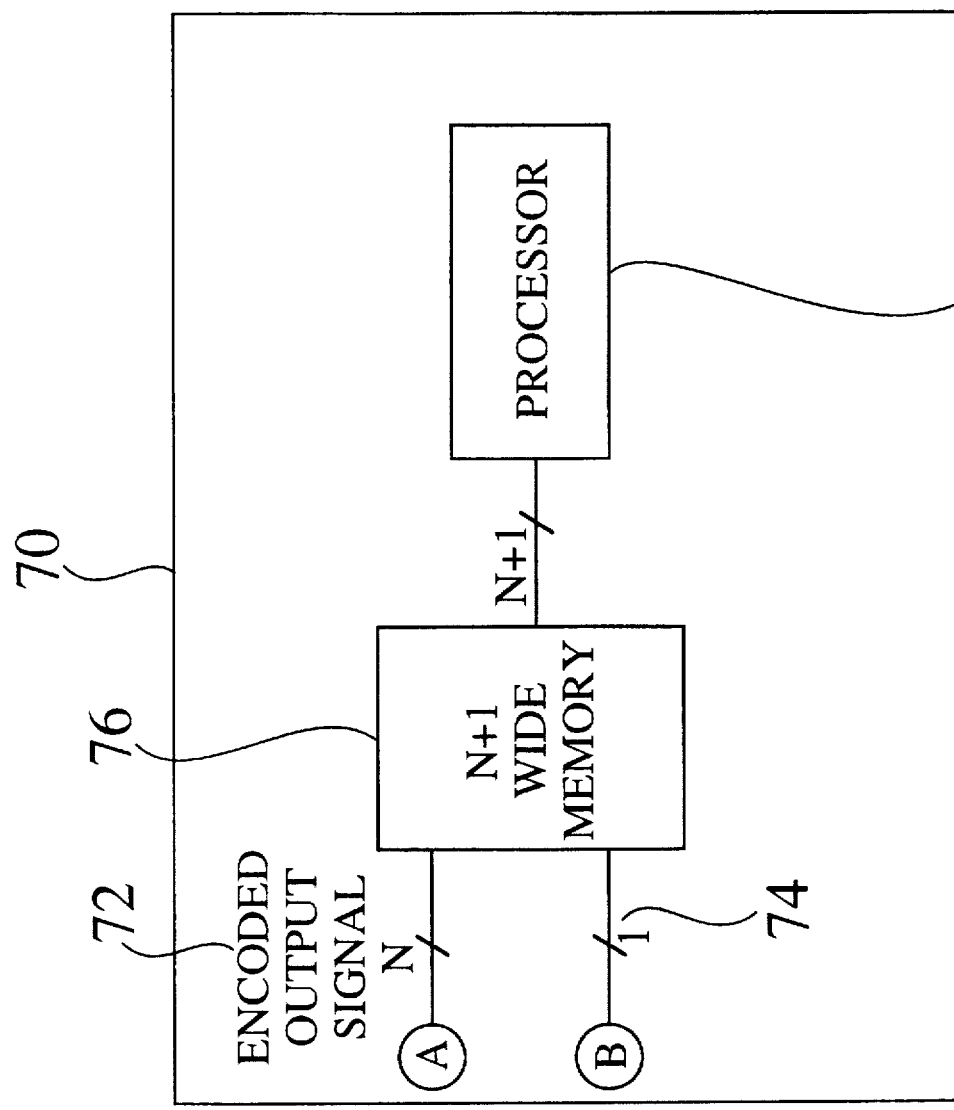
FIG. 4 is a schematic diagram of a system showing data pipelining according to the invention.

One process for storing such signals is pipelining. FIG. 4 is a schematic diagram of a circuit 70 showing pipelining using a 1-bit PRN in this example. Intermediate digital pipelining adds the PRN to the encoded output signal 72. Thus, the encoded output signal is N+1 bits wide, rather than N-bits wide. The added bit, called the decoding bit 74, is stored as part of the encoded signal in an N+1 bit wide memory 76. The PRN stored together with the encoded output signal may then be used to decode the encoded output signal at a later time using a processor unit 80.

Figure 5:
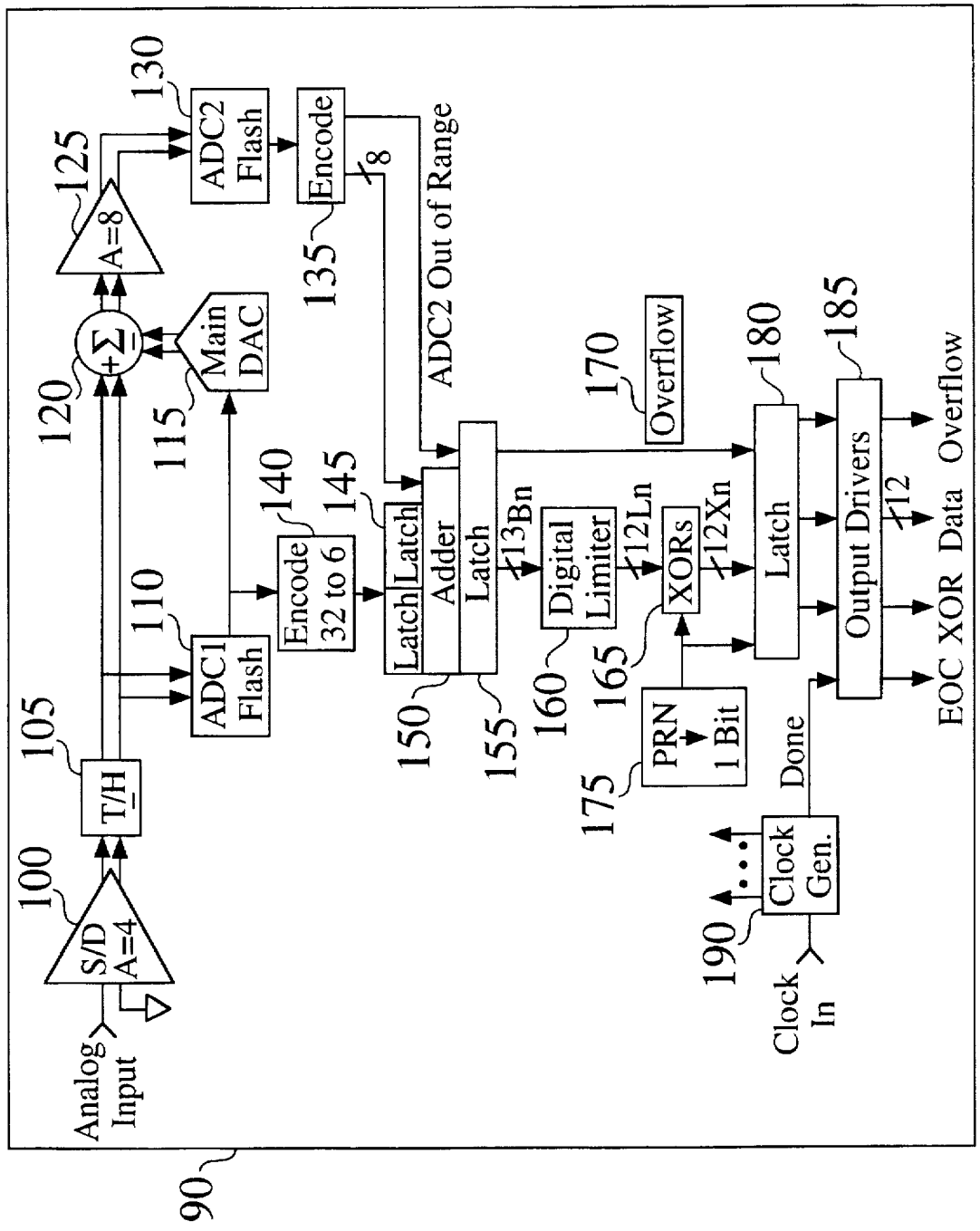
FIG. 5 is a block diagram of an integrated circuit including a system for preventing distortion in an analog-to-digital converter according to the invention.

FIG. 5 is a block diagram of an integrated circuit including the system for preventing distortion in an analog-to-digital converter, according to the invention. The analog input signal entering the integrated circuit 90 is first amplified. In the illustrated example, the amplifier is a single differential converter (S/D) 100 with a gain of 4. However, one skilled in the art will readily appreciate that the circuit may be implemented with different amplifier configurations. The differential output from the S/D is communicated to a differential track and hold device (TH) 105. A TH device follows a signal through a period of time called the track time, and holds the signal at the level of the signal at the end of the track time for a time called the hold time.

The held signal goes to a first analog-to-digital converter (ADC1) 110. This first ADC is a flash converter with 32 ($2^5$) output lines. A 32-to-6 bit encoder 140 encodes the output of the first ADC and provides a 6 bit binary output. Six binary bits are required because the 32-line thermometer output of the first ADC has 33 states which require six binary bits to encode them. The 32 output lines from the first ADC also drive a main digital-to-analog converter (DAC) 115 that is composed of 32 current sources. The output of the main DAC is then subtracted from the held signal by a subtractor device 120. In an alternative embodiment of the invention, this subtraction is performed by an adder-subtractor device.

The residue from the subtractor goes into an amplifier 125 with a gain of 8 and is then converted by a second analog-to-digital flash converter 130 (ADC2) to produce a multi-bit binary output. An encoder 135 creates an 8-bit binary signal from the multi-bit output. The 6-bit output of ADC1 and the 8-bit result of ADC2 pass through a latch 145 to an adder 150. The resulting sum is again latched by the latch 155. The latching is a pipelining step that gives a longer valid time for the data output.

The 13-bit result of the latch 155 potentially has some overflow. Any overflow that does occur is detected in the adder or in the second ADC, and is removed by a digital limiter 160. An overflow bit 170 is set if the result of the latching by latch 155 includes overflow. The 12 bit result from the digital limiter goes into an XOR 165 where it is XOR'd with one pseudo-random bit from a PRNG 175. This output is latched 180 and conveyed to the output drivers 185. The circuit is driven by a clock 190 that synchronizes both the initial analog-to-digital conversion and the circuit output.

Although the invention is described herein with reference to the preferred embodiment, one skilled in the art will readily appreciate that other applications may be substituted for those set forth herein without departing from the scope of the present invention.

For example, the number of stages in the linear feedback shift register may be varied according to the requirements of the particular application, with a larger LFSR providing an increased sequence length. The number and type of feedback arrangements in the LFSR may be similarly varied.

Furthermore, while the preferred embodiment of the invention uses a LFSR for pseudo-random-number generation, any other type of PRNG may alternatively be used. These are, in general, more complicated generators that require more circuitry. They may provide more flexibility or longer sequences, but in general they are more circuitry than is required for this application. Alternatively, the pseudo-random number may be generated by a software application Furthermore, when the raw digital output signals are transmitted off-chip in a multiple chip system, there is a possibility of on-board pin-to-pin crosstalk. Such crosstalk can significantly degrade the signal. In such multiple-chip system, an encoding chip is provided with dedicated pins that transmit the encoded output signal. Similar dedicated pins on the decoding chip receive the encoded data. The signal may then be regenerated by any of the methods described above, and without crosstalk interference.

The receiver circuit according to the invention may include a digital-to-analog converter, a computer-implemented system having a software application for decoding the encoded output system, a memory storage device, or an amplifier device.

Accordingly, the invention should only be limited by the claims included below.

I claim:

1. A method for preventing crosstalk between a raw digital output signal and an analog input signal in an analog-to-digital converter, the method comprising the steps of:

transmitting the raw digital output signal to a first XOR gate;

generating a first pseudo-random number; and performing an XOR operation at the first XOR gate between the raw digital output signal and the first pseudo-random number to generate an encoded output signal.

2. The method of claim 1, in which each pseudo-random number in the first sequence of pseudo-random numbers consists of a single bit.

3. The method of claim 1, in which the first sequence of pseudo-random numbers comprises N-bit words.

4. The method of claim 1, in which the step of generating a first sequence of pseudo-random numbers includes the steps of:

providing a linear feedback shift register; and using the linear feedback shift register to generate the first sequence of pseudo-random numbers.

5. The method of claim 1, further comprising a step of performing an XOR operation on the encoded output signal at a second XOR gate to re-generate the raw digital output signal.

6. The method of claim 5, in which the XOR operation at the second XOR gate is performed between the encoded output signal and the first sequence of pseudo-random numbers.

7. The method of claim 5, in which:

the first sequence of pseudo-random numbers is generated in response to a synchronizing signal;

the method additionally comprises a step of generating a second sequence of pseudo-random numbers, identical to the first sequence of pseudo-random numbers, in response to the synchronizing signal; and in the step of performing the second XOR operation, the second XOR operation is performed using the second sequence of pseudo-random numbers.

8. The method of claim 1, further comprising a step of storing at least one of the first sequence of pseudo-random numbers, the second sequence of pseudo-random numbers and the encoded output signal.

9. The method of claim 1, further comprising steps of:

latching an output of the XOR operation at the first XOR gate;

conveying the latched XOR output to at least one output driver; and synchronizing the analog-to-digital conversion and the latched XOR output to the at least one output driver.

10. A system for preventing crosstalk between a raw digital output signal and an analog input signal in an analog-to-digital converter having an analog input signal and a raw digital output signal, comprising:

means for generating a first pseudo-random number;

first XOR gate means for receiving the raw digital output signal and for performing an XOR operation between the raw digital output signal and the first pseudo-random number to generate an encoded output signal.

11. The system of claim 10, in which each pseudo-random number in the first sequence of pseudo-random numbers consists of a single bit.

12. The system of claim 10, in which the first sequence of pseudo-random numbers comprises N-bit words.

13. The system of claim 10, in which the means for generating a first sequence of pseudo-random numbers comprises a linear feedback shift register.

14. The system of claim 10, further comprising means for regenerating the raw digital output signal.

15. The system of claim 14, in which the means for regenerating the raw digital output signal includes a second XOR gate.

16. The system of claim 14, in which the second XOR gate is configured to perform an XOR operation with the encoded output signal and the first pseudo-random number to re-generate the raw digital output signal.

17. The system of claim 10, further comprising:

means for generating a second sequence of pseudo-random numbers; and means for synchronizing the means for generating the second sequence of pseudo-random numbers with the means for generating the first sequence of pseudo-random numbers.

18. The system of claim 17, in which the means for generating the second sequence of pseudo-random numbers is a linear feedback shift register.

19. The system of claim 12, further comprising memory means for storing at least one of the first sequence of pseudo-random numbers, the second sequence of pseudo-random numbers, and the encoded output signal.

20. The system of claim 12, further comprising:

at least one latch for latching an output of the XOR operation at the first XOR gate;

at least one output driver for receiving the latched XOR output; and a synchronizer for synchronizing the analog-to-digital converter and the latched XOR output to the at least one output driver.

\* \* \* \* \*